United States Patent
Gomm et al.

(10) Patent No.: US 7,078,951 B2
(45) Date of Patent: Jul. 18, 2006

(54) SYSTEM AND METHOD FOR REDUCED POWER OPEN-LOOP SYNTHESIS OF OUTPUT CLOCK SIGNALS HAVING A SELECTED PHASE RELATIVE TO AN INPUT CLOCK SIGNAL

(75) Inventors: Tyler Gomm, Meridian, ID (US); David Zimlich, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 10/928,424

(22) Filed: Aug. 27, 2004

(65) Prior Publication Data

US 2006/0044037 A1    Mar. 2, 2006

(51) Int. Cl.
*H03H 11/26* (2006.01)

(52) U.S. Cl. ...................... 327/261; 327/262
(58) Field of Classification Search ................ 327/261, 327/262, 269, 293, 299, 149, 158, 161, 291; 375/376, 373, 375; 331/DIG. 2, 17
See application file for complete search history.

(56) References Cited

U.S. PATENT DOCUMENTS

| | | | |
|---|---|---|---|
| 5,077,737 A | 12/1991 | Leger et al. ............... 371/10.1 |
| 5,309,035 A | 5/1994 | Watson, Jr. et al. ........ 307/269 |
| 5,369,640 A | 11/1994 | Watson et al. .................. 371/1 |
| 5,615,358 A | 3/1997 | Vogley ......................... 395/556 |
| 5,675,265 A | 10/1997 | Yamamori ...................... 327/3 |
| 5,694,377 A | 12/1997 | Kushnick ..................... 368/120 |
| 5,920,510 A | 7/1999 | Yukutake et al. ...... 365/189.05 |
| 5,963,502 A | 10/1999 | Watanabe et al. ........... 365/233 |
| 6,005,430 A | 12/1999 | Brown et al. ................ 327/277 |
| 6,060,928 A | 5/2000 | Jun et al. ..................... 327/261 |
| 6,069,508 A | 5/2000 | Takai .......................... 327/161 |
| 6,111,812 A | 8/2000 | Gans et al. .................. 365/233 |
| 6,111,925 A | 8/2000 | Chi ............................. 375/354 |
| 6,166,990 A | 12/2000 | Ooishi et al. ............... 365/233 |
| 6,175,605 B1 | 1/2001 | Chi ............................. 375/371 |
| 6,222,408 B1 | 4/2001 | Saeki .......................... 327/271 |
| 6,222,792 B1 | 4/2001 | Hanzawa et al. ........... 365/233 |

(Continued)

OTHER PUBLICATIONS

Cho, Uk-Rae et al., "*A 1.2-V 1.5-Gb/s 72-Mb DDR3 SRAM*", IEEE Journal of Solid-State Circuits, vol. 38, No. 11, Nov. 2003, pp. 1943-1950.

(Continued)

*Primary Examiner*—Linh My Nguyen
(74) *Attorney, Agent, or Firm*—Dorsey & Whitney LLP

(57) ABSTRACT

A signal generating circuit includes a pulse generator generating a pulse responsive to a periodic clock reference signal. The pulse propagates through a plurality of series-connected delay elements in a measurement delay line. The measurement delay line is coupled to a series of latches that correspond to respective groups of delay elements in the measurement delay line. The delay element to which the pulse has propagated when the next pulse is received causes a corresponding latch to be set. The clock reference signal propagates through a signal generating delay line, which contains a sub-multiple of the number of delay elements in the measurement delay line, starting at a location corresponding to the set latch. The latch may remain set for a large number of periods of the clock reference signal so that it is not necessary for the clock reference signal to propagate through the measurement delay line each cycle.

66 Claims, 8 Drawing Sheets

U.S. PATENT DOCUMENTS

| | | | |
|---|---|---|---|
| 6,236,251 B1 | 5/2001 | Akamatsu | 327/144 |
| 6,300,807 B1 | 10/2001 | Miyazaki et al. | 327/158 |
| 6,310,822 B1 | 10/2001 | Shen | 365/233 |
| 6,313,674 B1 | 11/2001 | Akita et al. | 327/155 |
| 6,330,627 B1 | 12/2001 | Toda | 710/104 |
| 6,360,271 B1 | 3/2002 | Schuster et al. | 709/231 |
| 6,373,303 B1 | 4/2002 | Akita | 327/156 |
| 6,373,913 B1 | 4/2002 | Lee | 375/376 |
| 6,396,323 B1 | 5/2002 | Mizumo | 327/295 |
| 6,437,619 B1 | 8/2002 | Okuda et al. | 327/158 |
| 6,473,360 B1 | 10/2002 | Ooishi | 365/233 |
| 6,476,653 B1 | 11/2002 | Matsuzaki | 327/158 |
| 6,489,824 B1 | 12/2002 | Miyazaki et al. | 327/158 |
| 6,522,599 B1 | 2/2003 | Ooishi et al. | 365/233 |
| 6,560,716 B1 | 5/2003 | Gasparik et al. | 713/600 |
| 6,570,419 B1 | 5/2003 | Hanzawa et al. | 327/152 |
| 6,570,813 B1 | 5/2003 | Van De Graaff | 365/233 |
| 6,580,649 B1 | 6/2003 | Park | 365/189.07 |
| 6,605,969 B1 | 8/2003 | Mikhalev et al. | 327/158 |
| 6,608,514 B1 | 8/2003 | Akita et al. | 327/291 |
| 6,611,475 B1 | 8/2003 | Lin | 365/233 |
| 6,617,894 B1 | 9/2003 | Yoon et al. | 327/161 |
| 6,618,319 B1 | 9/2003 | Ooishi et al. | 365/233 |
| 6,621,316 B1 | 9/2003 | Kirsch | 327/161 |
| 6,636,110 B1 | 10/2003 | Ooishi et al. | 327/565 |
| 6,665,231 B1 | 12/2003 | Mizuno et al. | 365/233 |
| 6,745,271 B1 | 6/2004 | Toda | 710/104 |
| 6,794,913 B1 | 9/2004 | Stengel | 327/158 |
| 6,798,259 B1 | 9/2004 | Lin | 327/153 |
| 6,801,070 B1 | 10/2004 | Gomm et al. | 327/263 |
| 6,891,415 B1 * | 5/2005 | Mikhalev et al. | 327/158 |

OTHER PUBLICATIONS

Lin, Feng et al., "*A Register-Controlled Symmetrical DLL for Double-Data-Rate DRAM*", IEEE Journal of Solid-State Circuits, vol. 34, No. 4, Apr. 1999, pp. 565-568.

Matano, Tatsuya et al., "*A 1-Gb/s/pin 512-Mb DDRII SDRAM Using a Digital DLL and a Slew-Rate-Controlled Output Buffer*", IEEE Journal of Solid-State Circuits, vol. 38, No. 5, May 2003, pp. 762-767.

Saeki, Takanori et al., "*A 2.5-ns Clock Access, 250-MHz, 256-Mb SDRAM with Synchronous Mirror Delay*", IEEE Journal of Solid-State Circuits, vol. 31, No. 11, Nov. 1996, pp. 1656-1665.

Takai, Yasuhiro et al., "*A 250-Mb/s/pin, 1-Gb Double-Data-Rate SDRAM with a Bidirectional Delay and an Interbank Shared Redundancy Scheme*", IEEE Journal of Solid-State Circuits, vol. 35, No. 2, Feb. 2000, pp. 149-159.

\* cited by examiner

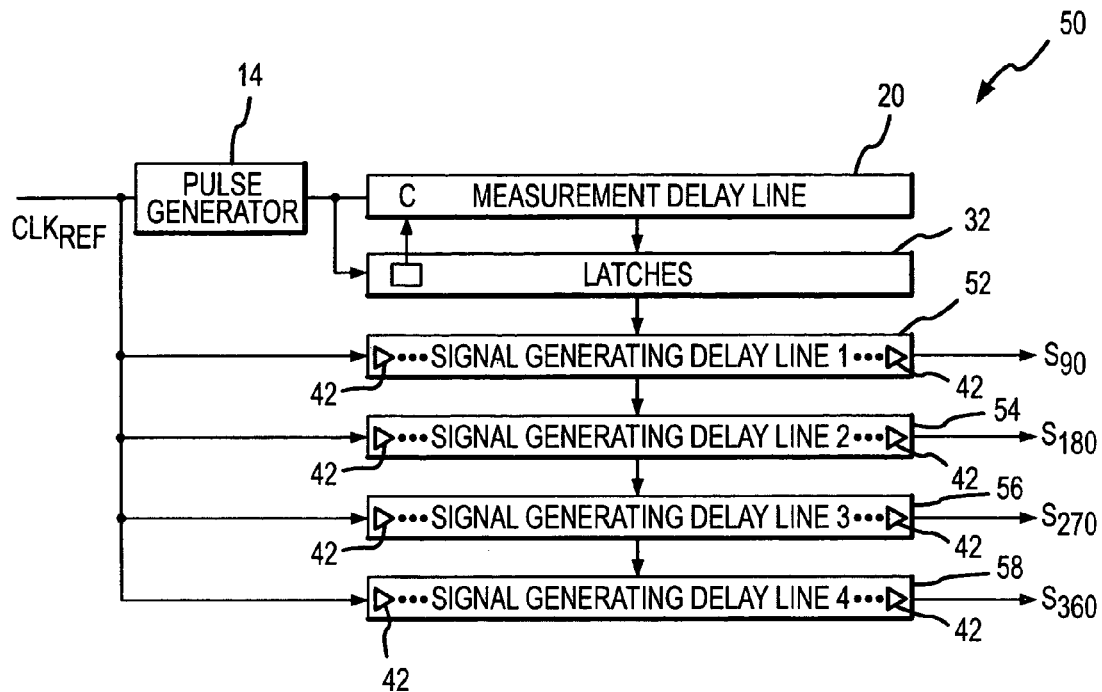
FIG.3
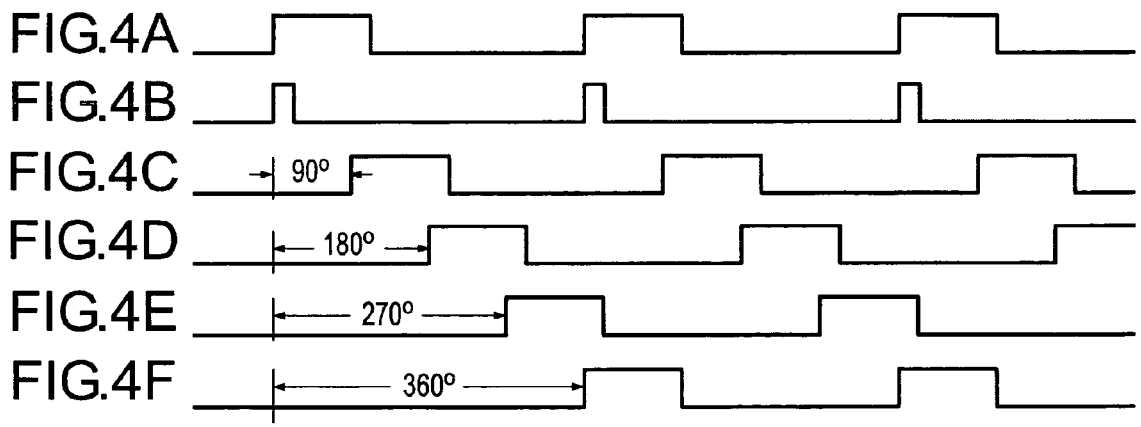

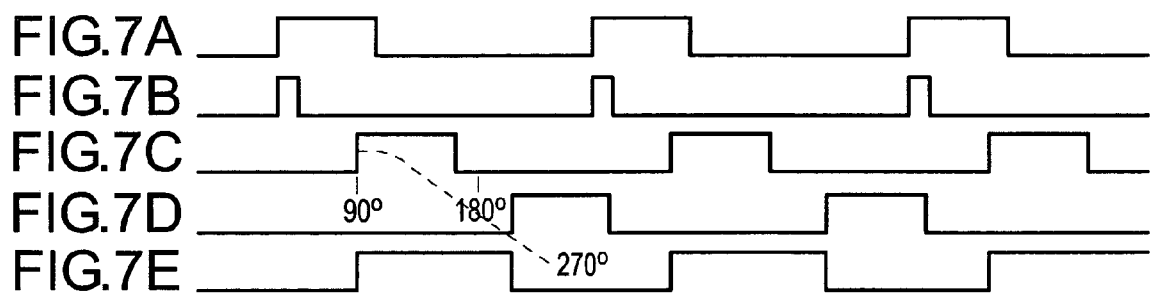
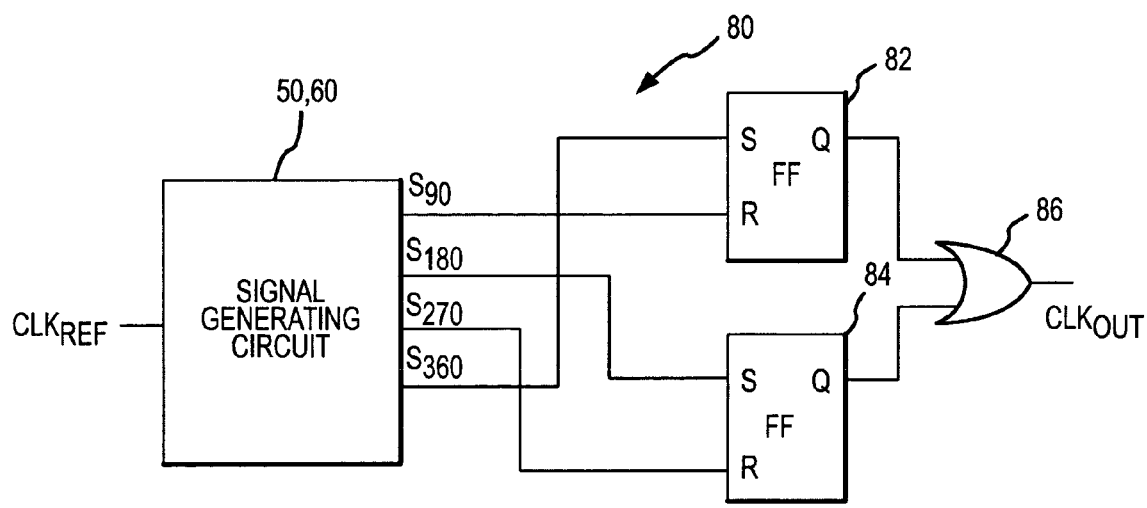
FIG.8

SYSTEM AND METHOD FOR REDUCED POWER OPEN-LOOP SYNTHESIS OF OUTPUT CLOCK SIGNALS HAVING A SELECTED PHASE RELATIVE TO AN INPUT CLOCK SIGNAL

TECHNICAL FIELD

This invention relates to clock generating systems and methods, and, more particularly, to a low power system and method for generating a clock signal that has a selected phase relative to another signal despite variations in the frequency of the other signal without using phase-lock loops, delay-lock loops and other closed-loop techniques.

BACKGROUND OF THE INVENTION

Periodic digital signals are commonly used in a variety of electronic devices. Probably the most common type of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal. More specifically, read data signals are typically coupled from a memory device in synchronism with a read data strobe signal, and write data signals are typically latched into a memory device in synchronism with a write data strobe signal. The read data strobe signal typically has the same phase as the read data signals, and it is normally generated by the same device that generates the read data signals. As a result, it is relatively easy to generate a read data strobe signal.

Unlike a read data strobe signal, a write data strobe signal normally must have a phase that is the quadrature of the write data signals so that a transition of the write data strobe signal occurs during a "data eye" occurring at the center of the period in which the write data signals are valid. However, as the speed of memory devices has continued to increase, the "data eye" has become smaller and smaller, thus making the timing of the write data strobe signal even more critical.

The write strobe signal is typically generated by the memory controller from a system clock signal and it is coupled to the memory device into which the data are being written. Unfortunately, the phase of the system clock signal is normally substantially the same as the phase of the write data signals. Therefore, it is necessary for the memory controller to generate the write data strobe signal as a quadrature signal having a phase that is 90-degrees relative to the phase of the system clock signal.

Various techniques can be used and have been used by memory devices to generate a quadrature write data strobe signal. If the frequency of the system clock signal is fixed, a quadrature write strobe signal can be generated by a timing circuit that simply generates a transition of the write strobe signal a fixed time after a corresponding transition of the system clock signal. However, synchronous memory devices are typically designed and sold to be operated over a wide range of system clock frequencies. Therefore, it is generally not practical to use a fixed timing circuit to generate a write data strobe signal from the system clock signal. Instead, a circuit that can adapt itself to a system clock signal having a range of frequencies must be used.

One conventional circuit that can generate a quadrature write data strobe signal from a system clock signal having a variable frequency is a phase-lock loop in which a voltage controlled oscillator generates a signal that is coupled to a phase detector along with the master clock signal. The phase detector generates an error signal that is used to control the frequency of the signal generated by the voltage controlled oscillator. Various signal processing techniques can be used to generate a quadrature signal from the signal generated by the voltage controlled oscillator.

Closed loop circuits, such as phase-lock loops and delay-lock loops, can accurately generate a quadrature write strobe signal based on the system clock signal over a substantial range of frequencies of the system clock signal. However, closed loop circuits are not without their disadvantages and limitations. Specifically, closed loop circuits typically require a substantial amount of circuitry, which occupies space on a semiconductor die that could otherwise be used for increased memory capacity. Furthermore, it typically requires a substantial period of time for the closed loop circuit to establish "lock" during which time the memory device cannot latch write data signals.

Quadrature digital signals are also required for applications other than for use as a write data strobe signal. For example, a "frequency doubler" circuit, which generates an output clock signal having twice the frequency of an input clock signal, can be implemented using an appropriate logic circuit that receives the input clock signal and quadrature versions of the input clock signal. However, generating the necessary quadrature clock signal has the same type of difficulties that are incurred in generating a quadrature write data strobe signal.

The limitations and disadvantages of conventional closed-loop clock generating circuit, such as phase-lock loops and delay-lock loops, have been addressed by an open loop system described in U.S. patent application Ser. No. 10/854,849 to Zimlich. Briefly, an input clock signal propagates through a measurement delay line having a plurality of delay elements. The delay element to which a transition, e.g., the rising edge, of the input clock signal has propagated at the next transition of the input clock signal (i.e., one period after the start of the clock pulse) sets a bit in corresponding delay element of a signal generating delay line having a sub-multiple of the number of delay elements. The set bit then propagates through the signal generating delay line. If, for example, the measurement delay line has twice as many delay elements as the signal generating delay line, the signal propagating through the signal generating delay line will be output one-half period after the start of each input clock signal. If the measurement delay line has four times as many delay elements as the signal generating delay line, the signal propagating through the signal generating delay line will be output one-quarter period after the start of each input clock signal. By using multiple signal delay lines each having a different sub-multiple number of delay elements compared to the number delay elements in the measurement delay line, any number of different phases of the input clock signal can be generated.

Although this open loop clock generating system avoids many of the disadvantages of closed-loop clock generating systems, it has the disadvantage of consuming a considerable amount of power. The high power consumption is, in part, the result of the power consumed by each cycle of the input clock signal propagating through the measurement delay line. The power consumed by the measurement delay line is particularly high because the measurement delay line contains a large number of delay elements, each of which consumes power each time it switches.

There is therefore a need for an open loop system and method for generating a periodic signal having a selected phase relative to another periodic signal that consumes a relatively little amount of power.

SUMMARY OF THE INVENTION

A system and method for generating an output clock signal having a selected phase shift relative to an input clock signal is generated in an open-loop manner using a measurement delay line having a plurality of delay elements and one or more signal generating delay lines having a respective sub-multiple of delay elements. An input clock signal propagates through the measurement delay line, and the delay element to which a transition of the input clock signal has propagated at the next transition of the input clock signal sets a corresponding latch. The set latch determines the number of delay element in each signal generating delay line through which a signal propagates to generate a respective output signal. The latch may remain set for a large number of cycles of the input clock signal so that it is not necessary for the input clock signal to propagate through the measurement delay line each cycle. As a result, the power consumed by the measurement delay line can be greatly decreased.

BRIEF DESCRIPTION OF THE DRAWINGS

FIG. 3 is a block diagram of a circuit for generating multiple clock signals phased 90 degrees from each other according to one embodiment of the invention.

FIGS. 4A–4F are timing diagrams showing the operation of the circuit of FIG. 3.

FIGS. 7A–E are timing diagrams showing the operation of the circuit of FIG. 6.

FIG. 8 is a block diagram of a frequency doubler circuit using the quadrature and in-phase clock signals generated by the signal generating circuit of either FIG. 3 or FIG. 5.

DETAILED DESCRIPTION

Figure 1:
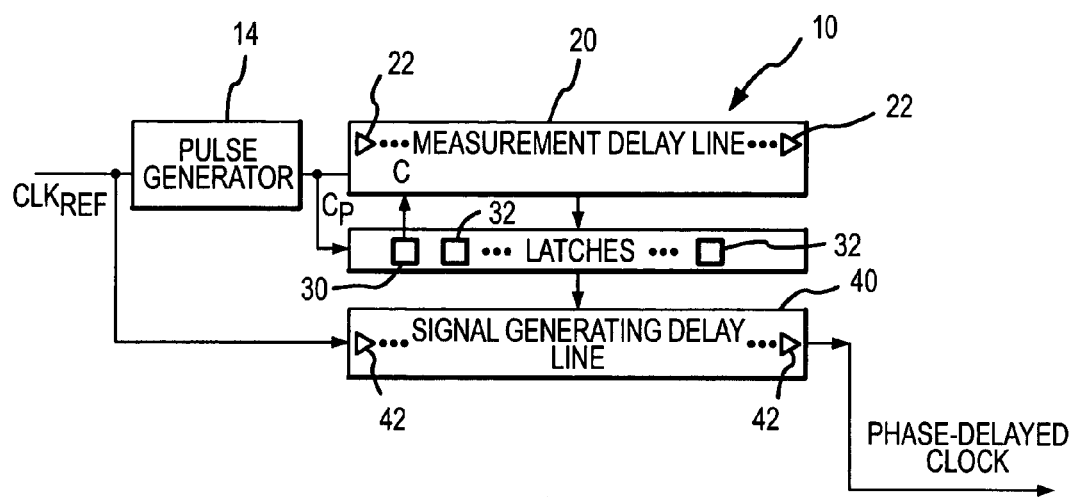
FIG. 1 is a block diagram of a circuit for generating quadrature clock signals according to one embodiment of the invention.

One embodiment of a signal generating circuit 10 for generating a quadrature clock signal is shown in FIG. 1. The circuit 10 receives a reference clock signal $CLK_{REF}$, which is applied to one input of a pulse generator 14. The pulse generator 14 outputs a short pulse $C_P$ responsive to a predetermined transition of the $CLK_{REF}$ signal, such as each rising edge of the $CLK_{REF}$ signal. The $C_P$ pulse is applied to the input of a measurement delay line 20, which includes a large number of delay elements 22. The delay line 20 may be similar to delay lines disclosed in previously mentioned application Ser. No. 10/854,849, filed May 25, 2004, which is hereby incorporated by reference. The $C_P$ pulse is also preferably applied to a counter 30 associated with a set of latches 32.

The $C_P$ pulse propagates through the delay elements 22 in the measurement delay line 20 until the next transition of the $C_P$ pulse occurs. The delay element 22 to which the $C_P$ pulse has propagated at that time then sets one of the latches 32. The particular latch 32 that is set depends upon which delay element 22 was responsible for setting the latch 32. The delay elements 22 further "downstream" (further to the right as shown in FIG. 1) set latches 32 that are further to the right as shown in FIG. 1, and vice-versa. However, there will generally not be a latch 32 provided for each of the delay elements 22 in the measurement delay line 20.

The signal generating circuit 10 also includes a signal generating delay line 40 that also includes a large number of series connected delay elements 42. The number of delay elements 42 in the signal generating delay line 40 is one-quarter of the number of delay elements 22 in the measurement delay line 20. In the embodiment 10 of FIG. 1, the $CLK_{REF}$ signal is coupled to the input of the signal generating delay line 40. However, the $CLK_{REF}$ signal is not applied to the first delay element 42 in the signal generating delay line 40. Instead, the delay element 42 to which the $CLK_{REF}$ signal is applied is determined by whatever latch 32 was set by the measurement delay line 20. For this reason, there are preferably the same number of delay elements 42 as there are latches 32. For example, if the measurement delay line 20 includes 100 delay elements 22, the signal generating delay line 40 will include 25 delay elements 42, and there will also be 25 latches 32. Every fourth delay element 22 will be coupled to a respective latch 32, and every latch 32 will be coupled to a respective delay element 42 in the signal generating delay line 40.

Figure 2A:
FIGS. 2A–2C are timing diagrams showing the operation of the circuit of FIG. 1.
Figure 2B:
Figure 2C:

The operation of the signal generating circuit 10 will now be explained with reference to the timing diagram shown in FIG. 2A–2C and using the example above in which there are 100 delay elements 22, and 25 delay elements 42 and latches 32. The $CLK_{REF}$ signal is shown in FIG. 2A. In response to each rising edge of the $CLK_{REF}$ signal, the pulse generator 14 generates a short $C_P$ pulse as shown in FIG. 2B. The $C_P$ pulse propagates though the delay elements 22 in the measurement delay line 20. By the time the next $C_P$ pulse occurs, the earlier $C_P$ pulse will have propagated though a number of delay elements 22 corresponding to the speed of the delay elements 22 and the period of the $CLK_{REF}$ signal. However, for reasons that will be apparent, the speed of the delay elements 22 is not a factor because, in the embodiment of FIG. 1, the delay elements 42 are identical to the delay elements 22 so that signals will propagate through the delay elements 42 at the same rate that signals propagate through the delay elements 22. Assume for purposes of example that the $C_P$ pulse has propagated to the $40^{th}$ delay element 22 when the measurement delay line 20 detects the next $C_P$ pulse. The $C_P$ pulse has thus propagated through 40 percent of the delay elements 22 in the measurement delay line 20. As a result, the measurement delay line 20 will set a latch 32 corresponding to the same percentage of the total number of latches 32, i.e., 40% of 25 latches 32. Therefore, the $10^{th}$ latch 32 (0.4*25) will be set.

When the $10^{th}$ latch 32 is set, it causes the next $CLK_{REF}$ signal to start propagating through the corresponding 10 delay element 42 in the signal generating delay line 40. After the $CLK_{REF}$ signal has propagated through 10 delay elements 20, an output signal is generated from by the $10^{th}$ delay element 42, which is coupled to the output of the signal generating delay line 40. This output signal has a phase that is offset from the phase of the $CLK_{REF}$ signal by one-quarter period or 90 degrees as shown in FIG. 2C because the $CLK_{REF}$ signal propagates through one-quarter as many delay elements 42 as the $C_P$ pulse propagated through the delay elements 22 during each period of the $CLK_{REF}$ signal.

The measurement delay line 20 thus determines which delay element 42 in the signal generating delay line 40 the $CLK_{REF}$ signal begins propagating to the output of the delay line 40. If the measurement delay line 20 made this determination for each period of the $CLK_{REF}$ signal, the signal generating circuit 20 would use a substantial amount of power because the $C_P$ pulse would propagate through the larger number of delay elements 22 each period of the $CLK_{REF}$ signal. However, the signal generating circuit 10 avoids consuming substantial power by using the measurement delay line 20 to make its determination periodically after a predetermined number of $CLK_{REF}$ periods have lapsed. It is for that reason the $C_P$ pulse is applied to the counter 30. The counter 30 outputs a disable signal to a control input C of the measurement delay line 20 that keeps the $C_P$ pulses from propagating through the delay line 20. After the counter 30 has counted a predetermined number of $C_P$ pulses, it allows the next $C_P$ pulse that is generated by the pulse generator 14 to propagate through the measurement delay line 20 and set one of the latches 32, as explained above. The delay element 22 to which the $C_P$ pulse has propagated when the next $C_P$ pulse is detected determines which latch 32 is set, as previously explained. The set latch 32 then determines the delay element 42 in the signal generating delay line 40 from which multiple periods of the $CLK_{REF}$ signal begin propagating though the delay line 40 until the counter 30 has again counted a predetermined number of $C_P$ pulses. As a result, the signal generating circuit 10 consumes relatively little power. Additional power savings are achieved in another embodiment by using the counter 30 to count transitions of the $CLK_{REF}$ signal rather than counting $C_P$ pulses, thus allowing power to be removed from the pulse generator 14.

Although one example of the signal generating circuit 10 has been shown and described, it will be understood that its components and operation may be varied as desired. The number of delay elements 22 used in the measurement delay line 20 control the resolution of the delay line 20, and can be increased or decreased as desired. By way of further example, it is not necessary for the delay elements 42 to have the same propagation speed as the delay elements 22. Instead, they can have different propagation speeds, and the relative number of delay elements 22, 42 can be adjusted accordingly. For example, the number of delay elements 42 can be equal to the number of delay elements 22 as long as the propagation speed of the delay elements 42 is one quarter the propagation speed of the delay elements 22. However, a signal generating circuit according to this example would simply increase the number of delay elements 42 will little apparent value. However, other variations will be apparent to one skilled in the art. For example, rather than using the latches 32 to control the entry point of the $CLK_{REF}$ signal in the signal generating delay line 40, the $CLK_{REF}$ signal could be applied to the first delay element 42 in the delay line 40, and the latches 32 could be used to select one of the delay elements 42 as the output point of the output clock signal.

Also, although the above discussions mention that the delay line 22 to which the $C_P$ pulse has propagated sets a corresponding latch 32, it will be understood that multiple latches 32 may be set. For example, as the $C_P$ pulse propagates through the delay elements 22 in the measurement delay line 20, corresponding latches 32 could be set. As a result, all of the latches 32 would be set up to and including the latch 32 corresponding to the delay line to which the $C_P$ pulse propagated when the next $C_P$ pulse was detected. Each set latch 32 could then enable a respective delay element 42 in one of the signal generating delay lines so that the $CLK_{REF}$ signal would propagate through the portion of the signal generating delay line corresponding to the portion of the measurement delay line 20 through which the $C_P$ pulse propagated. Other variations will be apparent to one skilled in the art.

Although the signal generating circuit 10 of FIG. 1 generates an output signal that is phased at 90 degrees relative to the $CLK_{REF}$ signal, it should be understood that other embodiments of the invention can generate a clock signal having any desired phase relative to the $CLK_{REF}$ signal. For example, if there are 120 delay elements 22 in the measurement delay line 20, then an output signal having a phase of 45 degrees relative to the $CLK_{REF}$ signal could be generated by using a signal generating delay line 40 having 15 delay elements 42 (i.e., one-eighth as may delay elements).

Other embodiments of the invention can also generate multiple output signals having different phases relative to the $CLK_{REF}$ signal using a single measurement delay line 20 and a single set of latches 32. With reference to FIG. 3, another embodiment of a signal generating circuit 50 uses the same pulse generator 14, measurement delay line 20 and latches 32 used in the signal generating circuit 10 of FIG. 1, and they operate in the same manner. Therefore, in the interest of brevity, the components common to both signal generating circuit 10, 50 have been provided with the same reference numerals, and an explanation of their operation will not be repeated.

The clock generating circuit 50 of FIG. 3 uses four signal generating delay lines 52, 54, 56, 58, all of which are controlled by the measurement delay line 20. In this embodiment, the delay line 52 contains one-quarter as many delay elements 42 as the delay elements 22 in the measurement delay line 20, and it therefore generates a first output signal $S_{90}$ that has a phase of 90 degrees relative to the phase of the $CLK_{REF}$ signal for the reasons explained above with reference to the signal generating circuit 10 of FIG. 1. The delay line 54 contains one-half as many delay elements 42 as the delay elements 22 in the measurement delay line 20, and it therefore generates a second output signal $S_{180}$ that has a phase of 180 degrees relative to the phase of the $CLK_{REF}$ signal. The delay line 56 contains three-quarters as many delay elements 42 as the delay elements 22 in the measurement delay line 20, and it therefore generates a third output signal $S_{270}$ that has a phase of 270 degrees relative to the phase of the $CLK_{REF}$ signal. Finally, the delay line 58 contains the same number of delay elements 42 as the delay elements 22 in the measurement delay line 20, and it therefore generates a fourth output signal $S_{360}$ that has a phase of 360 degrees relative to the phase of the $CLK_{REF}$ signal.

Another difference between the signal generating circuit 50 of FIG. 3 and the signal generating circuit 10 of FIG. 1 is that the interconnections between the latches 42 and the signal generating delay lines 54 56 must be different (although the connections to the signal generating delay line 52 can be the same). Insofar as the number of latches 42 is equal to the number of delay elements 42 in the delay line 52, and the delay line 54 contains twice the number of delay elements 42 than are contained in the delay line 52, the latches 32 must control twice as may delay elements 42 in the delay line 54. Therefore, each latch 32 preferably selects one of every other delay element 42 as the entry point of the $CLK_{REF}$ signal. Similarly, since the delay line 56 contains three times the number of delay elements 42 than are contained in the delay line 52, each latch 32 preferably selects one of every third delay element 42 as the entry point of the $CLK_{REF}$ signal. Finally, since the delay line 58 contains four times the number of delay elements 42 than are contained in the delay line 52, each latch 32 preferably selects one of every fourth delay element 42 as the entry point of the $CLK_{REF}$ signal.

The operation of the signal generating circuit 50 will now be explained with reference to the timing diagram shown in FIGS. 4A–4F. As shown in FIG. 4A, the $CLK_{REF}$ signal does not have a 50% duty cycle, so the compliment of the $CLK_{REF}$ signal cannot be used to generate a 180 degree phased signal. As explained above, in response to each rising edge of the $CLK_{REF}$ signal, the pulse generator 14 generates a short $C_P$ pulse as shown in FIG. 4B. The $C_P$ pulse propagates though the delay elements 22 in the measurement delay line 20, and a latch 32 is set having a location corresponding to the location of the delay element 22 to which the $C_P$ signal has propagated with the next $C_P$ pulse is received. The set latch 32 then selects one of the delay elements 42 in the delay line 52 as the entry point for the $CLK_{REF}$ signal. The $CLK_{REF}$ signal then propagates to the output of the delay line 52 with a delay of 90 degrees, as shown in FIG. 4C. Similarly, the $CLK_{REF}$ signal propagates to the output of the delay line 54 with a delay of 180 degrees, as shown in FIG. 4D, the $CLK_{REF}$ signal propagates to the output of the delay line 56 with a delay of 270 degrees, as shown in FIG. 4E, and the $CLK_{REF}$ signal propagates to the output of the delay line 58 with a delay of 270 degrees, as shown in FIG. 4F.

Figure 5:
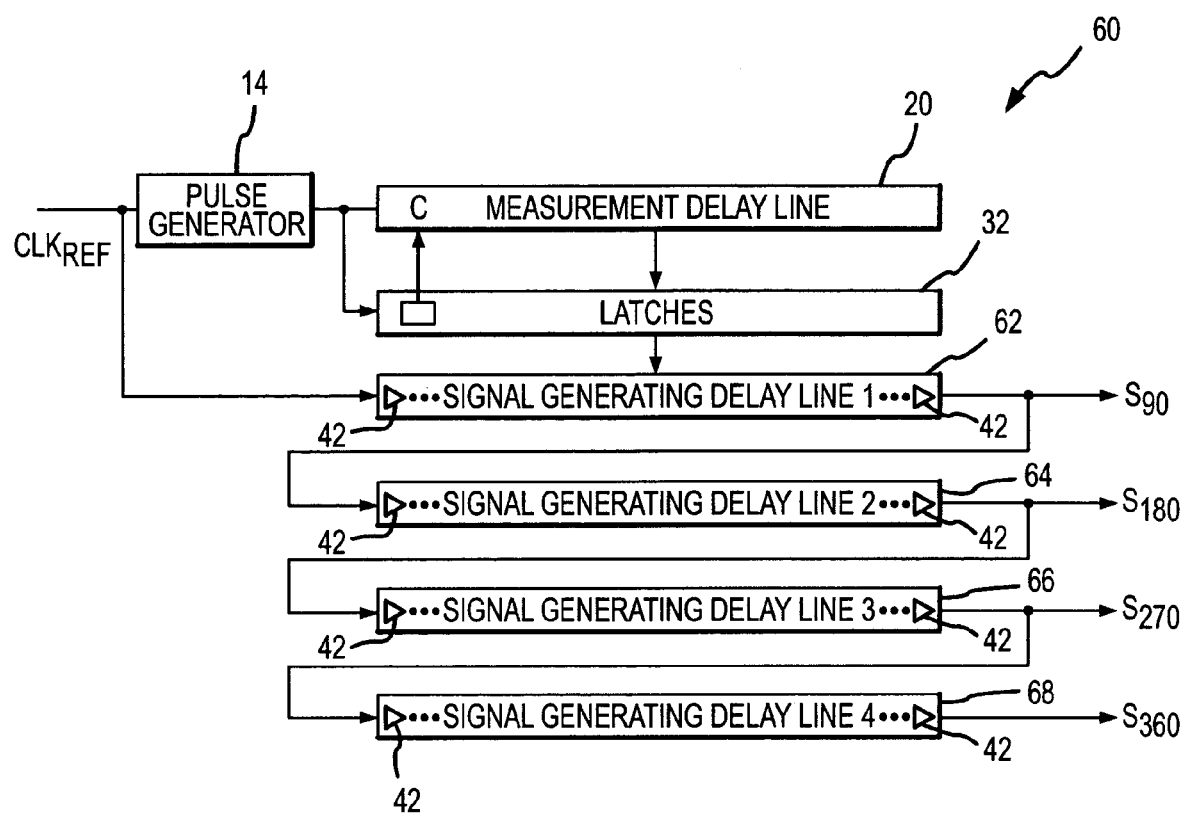
FIG. 5 is a block diagram of a circuit for generating multiple clock signals phased 90 degrees from each other according to another embodiment of the invention.

Although FIG. 3 shows one embodiment of a circuit for generating multiple phases of the $CLK_{REF}$ signal, other embodiments can also be used to generate multiple phases of the $CLK_{REF}$ signal. For example, in the signal generating circuit 60 shown in FIG. 5, four delay lines 62–68 that are identical to the delay line 52 can be used to generate the same four phases of the $CLK_{REF}$ signal. The signal entry point for each of the delay lines 62–68 are selected by the latches 32, and they are the same for all of the delay lines 62–68.

In operation, the first delay line 62 receives the $CLK_{REF}$ signal, and it delays the $CLK_{REF}$ signal by 90 degrees, as explained above, to generate an $S_{90}$ output signal. The second delay line 64 receives the $CLK_{REF}$ signal delayed by 90 degrees from the output of the first delay line 62, and delays it an additional 90 degrees so that generates an $S_{180}$ output signal, which is delayed from the $CLK_{REF}$ signal by 180 degrees. Similarly, the third delay line 66 receives the $CLK_{REF}$ signal delayed by 180 degrees from the output of the second delay line 64, and delays it an additional 90 degrees so that it generate an $S_{270}$ output signal, which is delayed from the $CLK_{REF}$ signal by 270 degrees. Finally, the fourth delay line 68 receives the $CLK_{REF}$ signal delayed by 270 degrees from the output of the third delay line 66, and delays it an additional 90 degrees so that it generates an $S_{360}$ output signal delayed from the $CLK_{REF}$ signal by 360 degrees.

Figure 6:
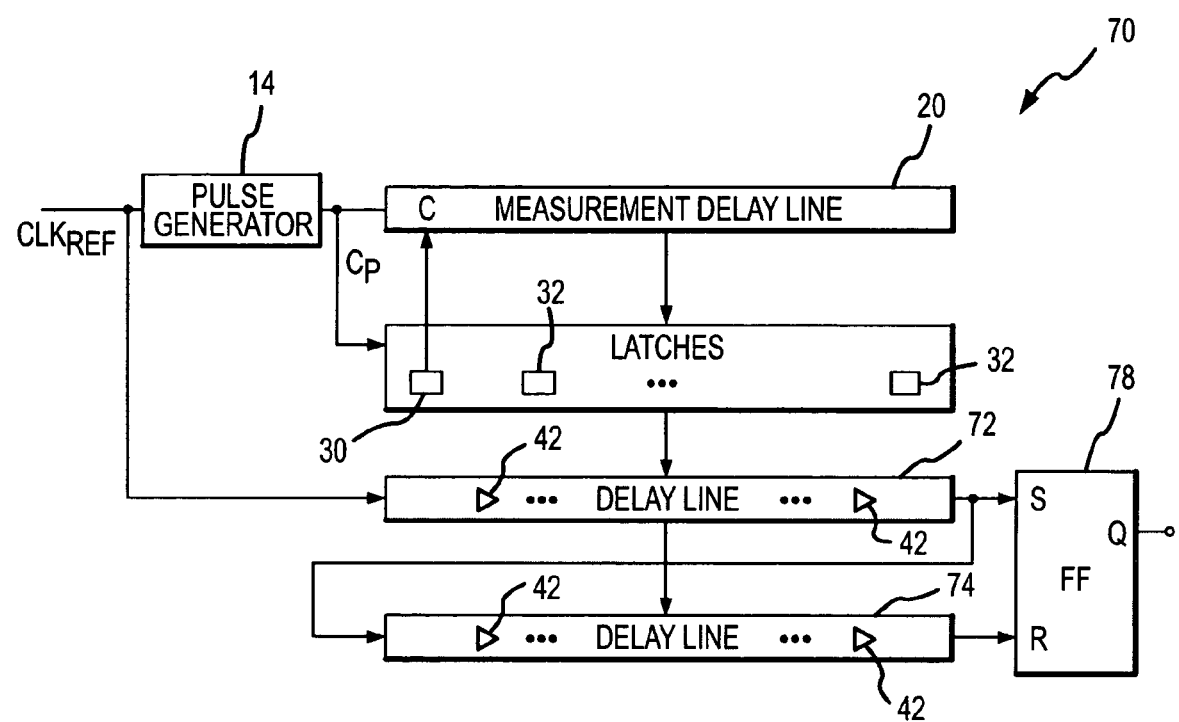
FIG. 6 is a block diagram of a circuit for generating output clock signals phased 90 degrees and 180 degrees relative to a reference clock signal using the embodiment of FIG. 5, and for using the output clock signals to correct the duty cycle of the reference clock signal.

Signal generating circuits according various embodiments of the invention can be used to generate other signals, such as a duty cycle corrected signal or a multiple of the $CLK_{REF}$ signal. For example, with reference to FIG. 6, a signal generating circuit 70 with two delay lines 72, 74 may be used with a set-reset flip-flop 78 to provide a duty cycle corrected version of the $CLK_{REF}$ signal. The first delay line 72 has one-quarter of the number of delay elements 42 as the number of delay elements 22 in the measurement delay line 20. It therefore provides a 90 degree delay. The second delay line 74 has one-half of the number of delay elements 42 as the number of delay elements 22 in the measurement delay line 20. It therefore provides a 180 degree delay. It can be seen from FIG. 7A that the $CLK_{REF}$ signal does not have a 50% duty cycle. The $CLK_{REF}$ signal is applied to the first delay line 72, which delays it by 90 degrees, as shown in FIG. 7C. This signal is applied to the set input "S" of the flip-flop 78. As a result, its output "Q" transitions high at a phase of 90 degrees relative to the phase of the $CLK_{REF}$ signal, as shown in FIG. 7E. The 90 degree delayed $CLK_{REF}$ signal from the delay line 72 is applied to the second delay line 74, which delays it by a delay of 180 degrees. As a result, the signal at the output of the delay line 74 is delayed 270 degrees relative to the phase of the $CLK_{REF}$ signal, as shown in FIG. 7D. This signal is applied to the reset input "R" of the flip-flop 78 so that its output transitions high at a phase of 270 degrees relative to the phase of the $CLK_{REF}$ signal, as shown in FIG. 7E. The resulting signal shown in FIG. 7E has the same frequency as the $CLK_{REF}$ signal, but its duty cycle has been corrected to 50%, and it has a phase that is delayed by 90 degrees relative to the phase of the $CLK_{REF}$ signal.

Figure 9:
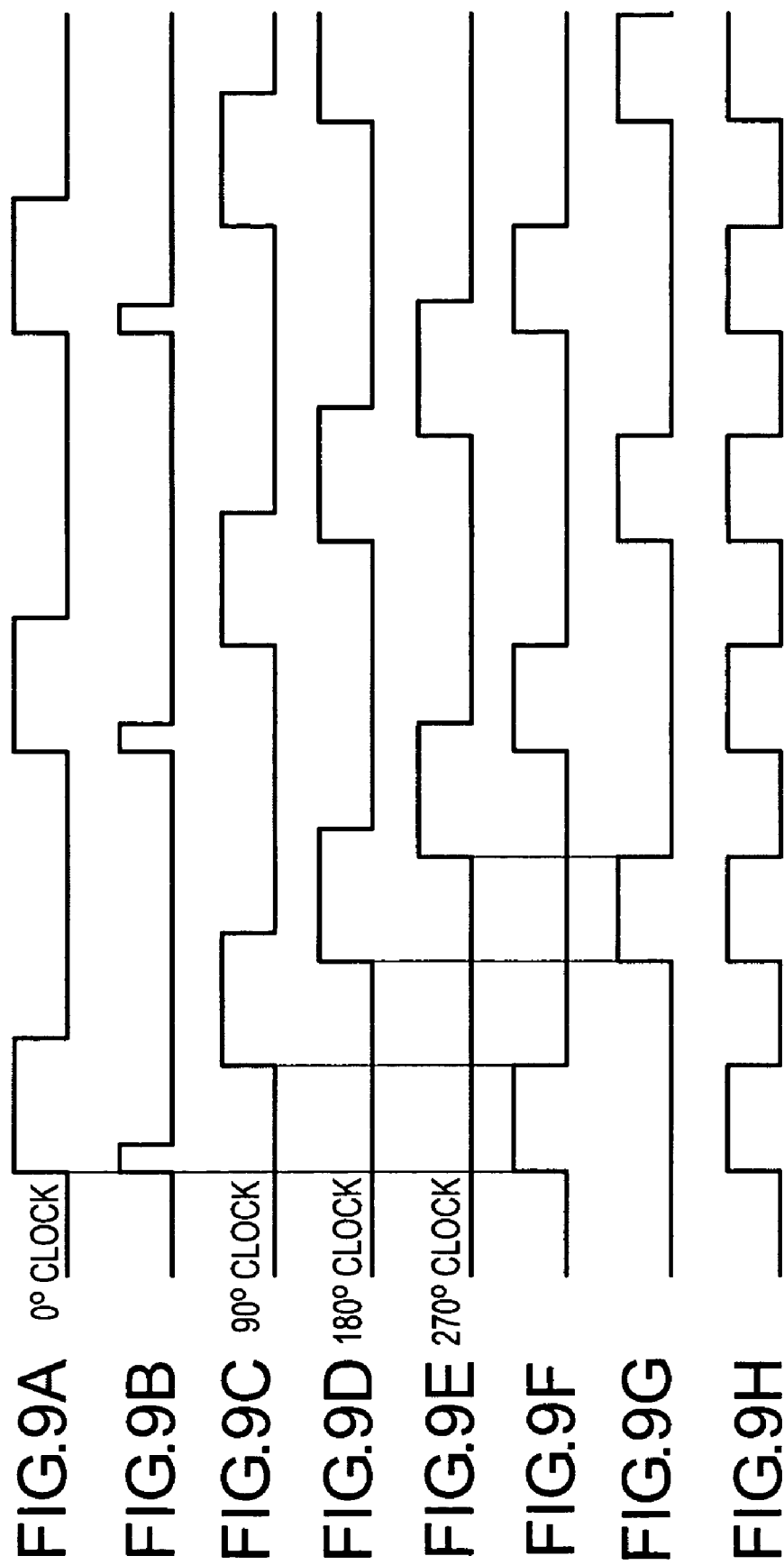
FIGS. 9A–H are timing diagrams showing the operation of the frequency doubler circuit of FIG. 8.

As mentioned above, various embodiments of the invention can be used to generate clock signals having frequencies that are a multiple of the frequency of the frequency of the $CLK_{REF}$ signal. With reference to FIG. 8, a frequency doubler circuit 80 uses either the signal generating circuit 50 shown in FIG. 3 or the signal generating circuit 60 shown in FIG. 5 to generate the four output signals $S_{90}$, $S_{180}$, $S_{270}$, $S_{360}$, which are phased 90 degrees from each other. The $CLK_{REF}$ signal is shown in FIG. 9A, the CP pulse is shown in FIG. 9B, and the $S_{90}$, $S_{180}$, $S_{270}$ output signals are shown in FIGS. 9C–9E, respectively. The $S_{360}$ signal is assumed to be identical to the $CLK_{REF}$ signal shown in FIG. 9A. The frequency doubler circuit 80 further includes a pair of set/reset flip-flops 82, 84 that are coupled to receive the output signals from the signal generating circuits 50, 60. The first flip-flop 82 is set by the $S_{360}$ output signal and reset by the $S_{90}$ signal. The output of the flip-flop 82 is therefore a signal that transitions high at 360 (or 0) degrees and transitions low at 90 degrees, as shown in FIG. 9F. Similarly, the second flip-flop 84 is set by the $S_{180}$ output signal and reset by the $S_{270}$ signal. The output of the flip-flop 84 is therefore a signal that transitions high at 180 degrees and transitions low at 270 degrees, as shown in FIG. 9G. The outputs of the flip-flops 102, 104 are combined by an OR gate 86 to generate the $CLK_{OUT}$ signal shown in FIG. 9H, which has twice the frequency of the $CLK_{REF}$ signal. Moreover, the $CLK_{OUT}$ signal has a 50% duty cycle. Thus, various embodiments of the invention can combine delayed clock signals to generate an output clock signal having any desired phase relative to the $CLK_{REF}$ signal as well as any desired duty cycle.

Signal generating circuits according to various embodiments of the present invention can be used for a variety of purposes in electronic devices, such as memory devices. For example, with reference to FIG. 10, a synchronous dynamic random access memory ("SDRAM") 200 includes a command decoder 204 that controls the operation of the SDRAM 200 responsive to high-level command signals received on a control bus 206 and coupled thorough input receivers 208. These high level command signals, which are typically generated by a memory controller (not shown in FIG. 10), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 204 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted.

The SDRAM 200 includes an address register 212 that receives row addresses and column addresses through an address bus 214. The address bus 214 is generally coupled through input receivers 210 and then applied to a memory controller (not shown in FIG. 10). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses are generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242 which applies a sequence of column addresses to the column address buffer 244 starting at the column address output by the address register 212. In either case, the column address buffer 244 applies a column address to a column decoder 248.

Figure 10:
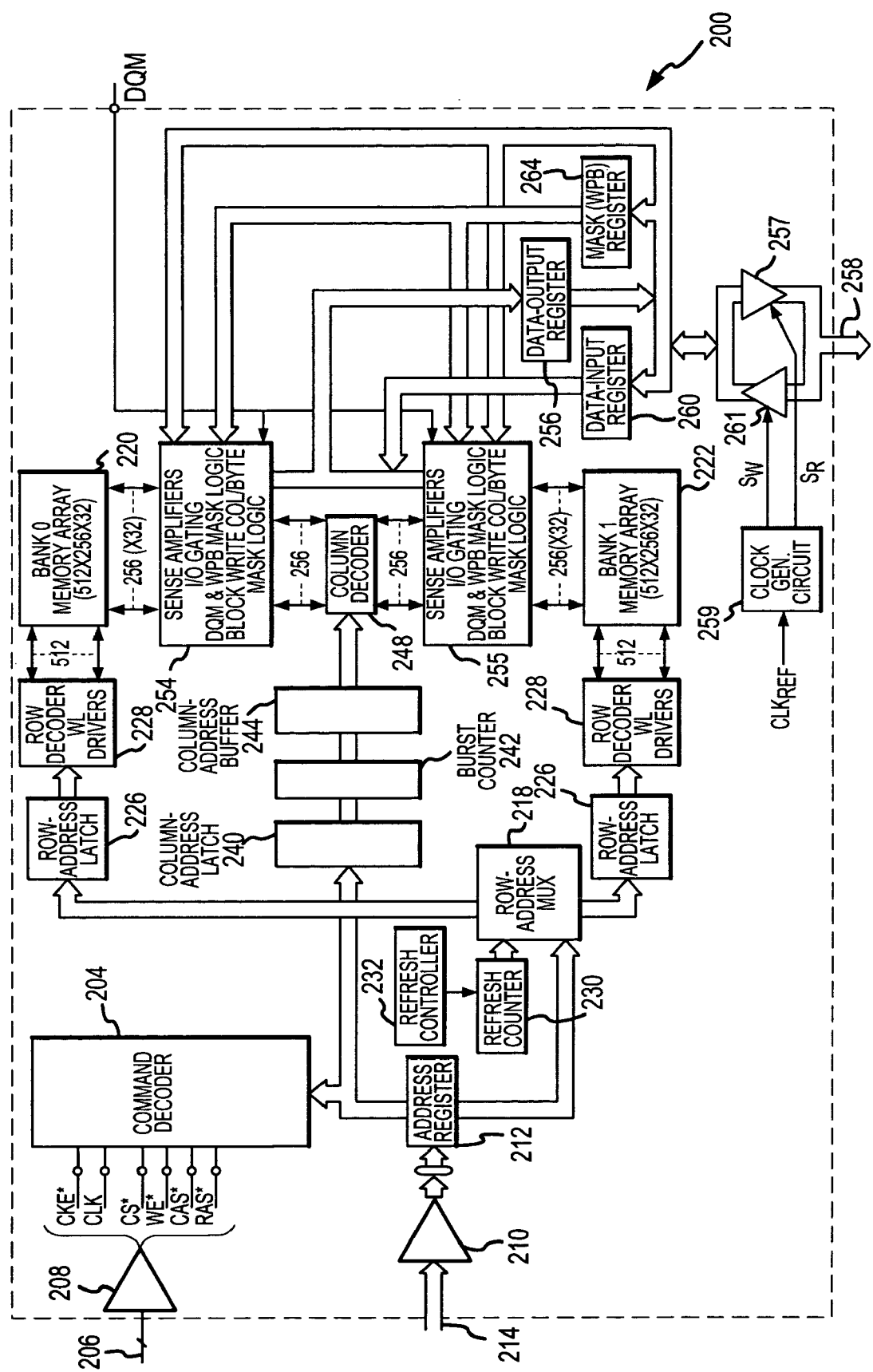
FIG. 10 is a block diagram of a memory device using the quadrature and in-phase clock signals generated a signal generating circuit according to one embodiment of the invention.

Data to be read from one of the arrays 220, 222 is coupled to the column circuitry 254, 255 for one of the arrays 220, 222, respectively. The data is then coupled through a data output register 256 and data output drivers 257 to a data bus 258. The data output drivers 257 apply the read data to the data bus 258 responsive to a read data strobe signal SR generated by a various embodiments of a signal generating circuit 259 in accordance with the present invention. The SDRAM 200 shown in FIG. 10 is a double data rate ("DDR") SDRAM that inputs or outputs data twice each clock period. The signal generating circuit 259 receives the periodic $CLK_{REF}$ signal and generates the read data strobe SR responsive to $CLK_{360}$ and $CLK_{180}$ signal, which are generated as explained above. As a result, the read data are coupled to the data bus 258 in substantially in phase with the $CLK_{REF}$ signal and 180 degrees from the phase of the $CLK_{REF}$ signal.

Data to be written to one of the arrays 220, 222 are coupled from the data bus 258 through data input receivers 261 to a data input register 260. The data input receivers 261 couple the write data from the data bus 258 responsive to a write data strobe signal $S_w$ generated responsive to $CLK_{90}$ and $CLK_{270}$ signals, which are generated as explained above. As a result, the write data are coupled into the SDRAM 200 from the data bus 258 at the center of a "data eye" corresponding to the phase of the $CLK_{REF}$ signal. The write data are coupled to the column circuitry 254, 255 where they are transferred to one of the arrays 220, 222, respectively. A mask register 264 responds to a data mask DM signal to selectively alter the flow of data into and out of the column circuitry 254, 255, such as by selectively masking data to be read from the arrays 220, 222.

Figure 11:
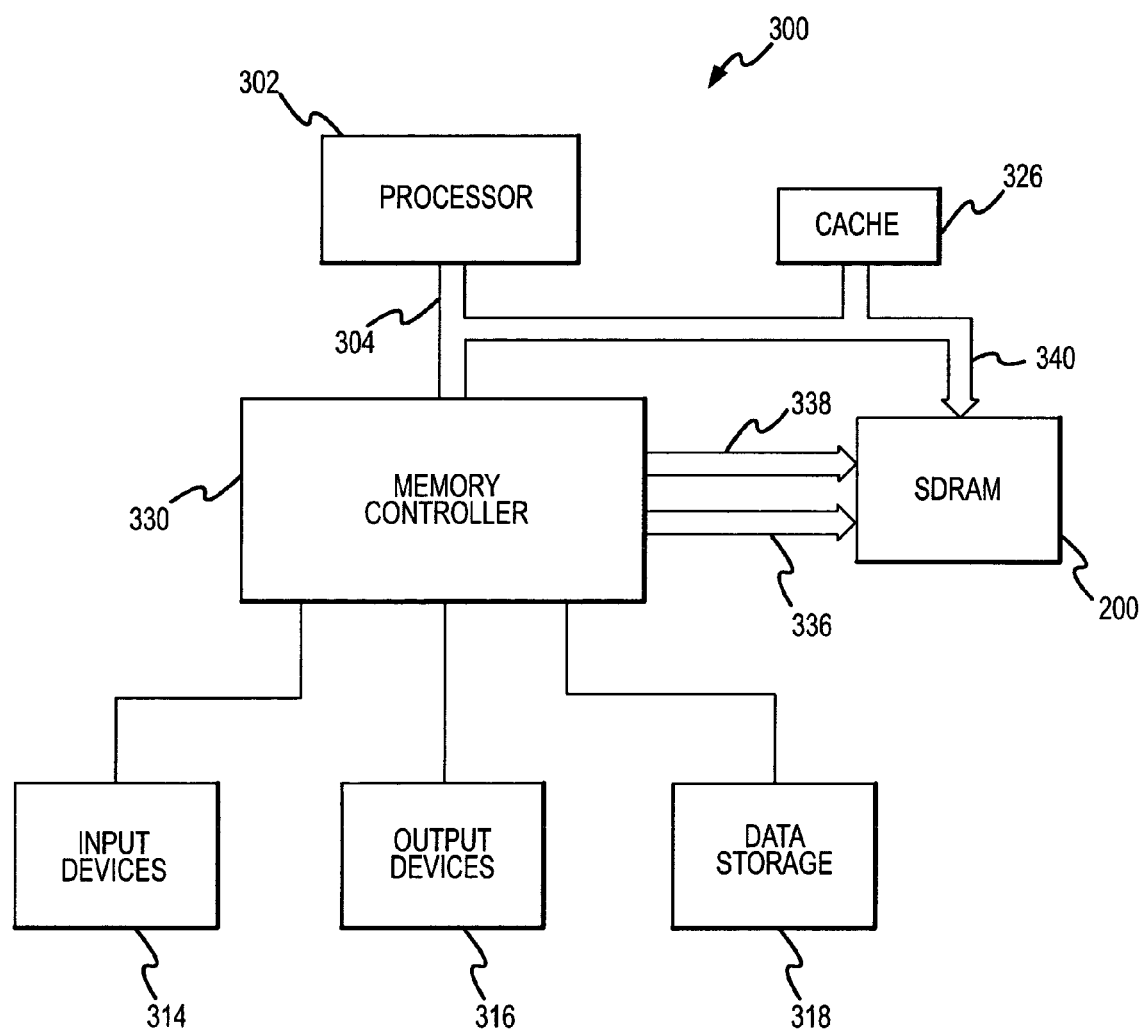
FIG. 11 is a block diagram of a processor-based system using the memory device of FIG. 10.

The SDRAM 200 shown in FIG. 10 can be used in various electronic systems. For example, it may be used in a computer system, such as a a computer system 300 shown in FIG. 11. The computer system 300 includes a processor 302 for performing various computing functions, such as executing specific software to perform specific calculations or tasks. The processor 302 includes a processor bus 304 that normally includes an address bus, a control bus, and a data bus. In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data in or retrieve data from internal or external storage media (not shown). Examples of typical storage devices 318 include hard and floppy disks, tape cassettes, and compact disk read-only memories (CD-ROMs). The processor 302 is also typically coupled to cache memory 326, which is usually static random access memory ("SRAM"), and to the SDRAM 200 through a memory controller 330. The memory controller 330 normally includes a control bus 336 and an address bus 338 that are coupled to the SDRAM 200. A data bus 340 is coupled from the SDRAM 200 to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A system for generating an output signal that has a predetermined phase relative to a periodic input clock signal, comprising:

a measurement delay line including a plurality of delay circuits coupled in series with each other from an initial delay circuit that is coupled to receive a first input signal to a final delay circuit, the first input signal having transitions corresponding to predetermined transitions of the input clock signal, the delay circuits propagating the first input signal through the delay circuits from the initial delay circuit toward the final delay circuit, the delay circuits being divided into subsets of delay circuits coupled in series with each other, the subset containing a delay circuit to which a transition of the first input signal has propagated when a subsequent transition of the first input signal is received generating a control signal;

a plurality of latches each of which corresponds to a respective one of the subsets of the delay circuits in the measurement delay line, each of the latches having a set input that is coupled to receive the control signal from the corresponding set of delay circuits, the control signal being operable to set the latch; and a signal generating delay line having a plurality of delay circuits coupled in series with each other, the number of delay circuits in the signal generating delay line being a sub-multiple of the number of delay circuits in the measurement delay line, the delay circuits in the signal generating delay line being divided into subsets of delay circuits that are coupled in series with each other, the signal generating delay line receiving a second input signal having transitions corresponding to predetermined transitions of the input clock signal, the number of delay circuits in the signal generating delay line through which the second input signal propagates to generate an output signal being controlled by the set latch so that the percentage of delay circuits in the signal generating delay line through which the second input signal propagates is substantially the same as the percentage of delay circuits in the measurement delay line through which the first input signal propagates.

2. The system of claim 1, further comprising a control circuit that is operable to disable the first input signal from propagating through the measurement delay line for a plurality of periods of the input clock signal after the control signal has been generated by one of the subsets of delay circuits in the measurement delay line.

3. The system of claim 2 wherein the control circuit comprises a counter that is operable to count periods of the input clock signal until a predetermined count is reached, the counter being operable to disable the first input signal from propagating through the measurement delay until the predetermined count is reached.

4. The system of claim 3 wherein the counter is operable to cause the latch to be set by the control signal responsive to the counter counting to the predetermined count.

5. The system of claim 1 wherein each of the subsets of the delay circuits in the measurement delay line contain 4 delay circuits.

6. The system of claim 5 wherein each of the subsets of the delay circuits in the signal generating delay line contain 1 delay circuit, and the output signal has a phase that is delayed from the first input signal by 90 degrees.

7. The system of claim 5 wherein each of the subsets of the delay circuits in the signal generating delay line contain 2 delay circuits, and the output signal has a phase that is delayed from the first input signal by 180 degrees.

8. The system of claim 5 wherein each of the subsets of the delay circuits in the signal generating delay line contain 3 delay circuits, and the output signal has a phase that is delayed from the first input signal by 270 degrees.

9. The system of claim 1, further comprising a pulse generator coupled to receive the input clock signal, the pulse generator generating a pulse that is used as the first input signal responsive to predetermined transitions of the input clock signal.

10. The system of claim 9 wherein the predetermined transitions of the input clock signal to which the pulse generator is responsive comprises rising edge transitions of the input clock signal.

11. The system of claim 1 wherein the number of delay circuits in the signal generating delay line comprises one-quarter of the number of delay circuits in the measurement delay line.

12. The system of claim 11 wherein the output signal has a phase that is delayed from the first input signal by 90 degrees.

13. The system of claim 1 wherein the number of delay circuits in the signal generating delay line comprises one-half of the number of delay circuits in the measurement delay line.

14. The system of claim 13 wherein the output signal has a phase that is delayed from the first input signal by 180 degrees.

15. The system of claim 1 wherein the number of delay circuits in the signal generating delay line comprises three-quarters of the number of delay circuits in the measurement delay line.

16. The system of claim 15 wherein the output signal has a phase that is delayed from the first input signal by 270 degrees.

17. The system of claim 1 wherein the second input signal comprises the input clock signal.

18. The system of claim 1 wherein the number of delay circuits in the signal generating delay line through which the second input signal propagates is controlled by selecting the delay line to which the second input signal is coupled.

19. The system of claim 1 wherein the signal generating delay line comprises a first signal generating delay line, and wherein the system further comprises a second signal generating delay line receiving the second input signal and having a plurality of delay circuits coupled in series with each other, the number of delay circuits in the second signal generating delay line being a sub-multiple of the number of delay circuits in the measurement delay line and being different from the sub-multiple of delay circuits in the first signal generating delay line, the delay circuits in the second signal generating delay line being divided into subsets of delay circuits that are coupled in series with each other, the number of delay circuits in the second signal generating delay line through which the second input signal propagates to generate an output signal being controlled by the set latch so that the percentage of delay circuits in the second signal generating delay line through which the second input signal propagates is substantially the same as the percentage of delay circuits in the measurement delay line through which the first input signal propagates.

20. The system of claim 19, wherein the output signal from the first signal generating delay line has a phase of 90 degrees relative to the phase of the input clock signal, and the output signal from the second signal generating delay line has a phase of 180 degrees relative to the input clock signal, and wherein the system further comprises:

a third signal generating delay line receiving the second input signal and having a plurality of delay circuits coupled in series with each other, the number of delay circuits in the second signal generating delay line being a sub-multiple of the number of delay circuits in the measurement delay line and being different from the sub-multiple of delay circuits in the first and second signal generating delay, the delay circuits in the second signal generating delay line being divided into subsets of delay circuits that are coupled in series with each other, the number of delay circuits in the second signal generating delay line through which the second input signal propagates to generate an output signal being controlled by the set latch so that the percentage of delay circuits in the third signal generating delay line through which the second input signal propagates is substantially the same as the percentage of delay circuits in the measurement delay line through which the first input signal propagates; and a fourth signal generating delay line receiving the second input signal and having a plurality of delay circuits coupled in series with each other, the number of delay circuits in the fourth signal generating delay line being a sub-multiple of the number of delay circuits in the measurement delay line and being different from the sub-multiple of delay circuits in the first, second and third signal generating delay lines, the delay circuits in the fourth signal generating delay line being divided into subsets of delay circuits that are coupled in series with each other, the number of delay circuits in the fourth signal generating delay line through which the second input signal propagates to generate an output signal being controlled by the set latch so that the percentage of delay circuits in the fourth signal generating delay line through which the second input signal propagates is substantially the same as the percentage of delay circuits in the measurement delay line through which the first input signal propagates.

21. The system of claim 20 wherein the output signals from the first, second third and fourth signal generating delay lines have phases that are phased differently from each other by 90 degrees.

22. The system of claim 21, further comprising a logic circuit coupled to receive the output signals from the first, second, third and fourth signal generating delay lines, the logic circuit being operable to combine the output signals from the first, second, third and fourth signal generating delay lines to generate an output clock signal having a frequency that is a multiple of the frequency of the input clock signal.

23. The system of claim 22 wherein the logic circuit comprises:
  a first flip-flop having a set input coupled to receive the output signal from the first signal generating delay line and a reset input coupled to receive the output signal from the second signal generating delay line;
  a second flip-flop having a set input coupled to receive the output signal from the third signal generating delay line and a reset input coupled to receive the output signal from the fourth signal generating delay line; and
  a logic gate having a first input coupled to an output of the first flip-flop and a second input coupled to an output of the second flip-flop, the logic gate having an output from which the output clock signal is generated.

24. The system of claim 18 wherein the output signal of the second signal generating delay line has a phase that is a compliment of the phase of the output signal of the first signal generating delay line.

25. The system of claim 24, further comprising a duty cycle correcting circuit, comprising a flip-flop having set and reset inputs, one of the set and reset inputs being coupled to receive the output signal from the first signal generating delay line and the other of the set and reset inputs being coupled to receive the output signal from the second signal generating delay line, the flip-flop having an output from which a duty cycle corrected clock signal is generated.

26. The system of claim 1 wherein the signal generating delay line comprises a first signal generating delay line, and wherein the system further comprises a second signal generating delay line receiving the output signal from the first signal generating delay line, the number of delay circuits in the second signal generating delay line being a sub-multiple of the number of delay circuits in the measurement delay line, the delay circuits in the second signal generating delay line being divided into subsets of delay circuits that are coupled in series with each other, the number of delay circuits in the signal generating delay line through which the output signal from the first signal generating delay line propagates to generate an output signal being controlled by the set latch so that the percentage of delay circuits in the second signal generating delay line through which the output signal from the first signal generating delay line propagates is substantially the same as the percentage of delay circuits in the measurement delay line through which the first input signal propagates.

27. The system of claim 21 wherein the second signal generating delay line is substantially identical to the first signal generating delay line, and it includes the same number of delay circuit that are divided into subsets containing the same number of delay circuits that the delay circuits in the first signal generating delay line are divided.

28. The system of claim 27 further comprising third and fourth signal generating delay lines that are substantially identical to the first signal generating delay line, and include the same number of delay circuit that are divided into subsets containing the same number of delay circuits that the delay circuits in the first signal generating delay line are divided, the third signal generating delay line receiving the output signal from the second signal generating delay line and the fourth signal generating delay line receiving the output signal from the third signal generating delay line, the output signals from the first, second, third and fourth signal generating delay lines having phases that are 90 degrees different from each other.

29. The system of claim 28, further comprising a logic circuit coupled to receive the output signals from the first, second, third and fourth signal generating delay lines, the logic circuit being operable to combine the output signals from the first, second, third and fourth signal generating delay lines to generate an output clock signal having a frequency that is a multiple of the frequency of the input clock signal.

30. The system of claim 29 wherein the logic circuit comprises:
  a first flip-flop having a set input coupled to receive the output signal from the first signal generating delay line and a reset input coupled to receive the output signal from the second signal generating delay line;
  a second flip-flop having a set input coupled to receive the output signal from the third signal generating delay line and a reset input coupled to receive the output signal from the fourth signal generating delay line; and
  a logic gate having a first input coupled to an output of the first flip-flop and a second input coupled to an output of the second flip-flop, the logic gate having an output from which the output clock signal is generated.

31. The system of claim 27 wherein the output signal of the second signal generating delay line has a phase that is a compliment of the phase of the output signal of the first signal generating delay line.

32. The system of claim 31, further comprising a duty cycle correcting circuit, comprising a flip-flop having set and reset inputs, one of the set and reset inputs being coupled to receive the output signal from the first signal generating delay line and the other of the set and reset inputs being coupled to receive the output signal from the second signal generating delay line, the flip-flop having an output from which a duty cycle corrected clock signal is generated.

33. A system for generating an output clock signal that has a predetermined phase relative to a periodic input clock signal, comprising:
- a measurement delay line including a plurality of delay circuits coupled in series with each other from an initial delay circuit that is coupled to receive a first input signal to a final delay circuit, the first input signal having transitions corresponding to predetermined transitions of the input clock signal, the delay circuits propagating the first input signal through the delay circuits from the initial delay circuit toward the final delay circuit;
- a plurality of latches coupled to the measurement delay line, the latches being set by the measurement delay line to provide an indication of the number of delay circuits in the measurement delay line through which a transition of the first input signal has propagated when a subsequent transition of the first input signal is received by the measurement delay line;
- a signal generating delay line having a plurality of delay circuits coupled in series with each other from an initial delay circuit that is coupled to receive a second input signal to a final delay circuit, the number of delay circuits in the signal generating delay line being a sub-multiple of the number of delay circuits in the measurement delay line, the operation of the signal generating delay line being controlled by the latches so that the percentage of delay circuits in the signal generating delay line through which the second input signal propagates to generate the output clock signal is substantially the same as the percentage of delay circuits in the measurement delay line through which the first input signal propagates when a subsequent transition of the first input signal is received by the measurement delay line; and
- a control circuit that is operable to disable the first input signal from propagating through the measurement delay line for a disable period.

34. The system of claim 33 wherein the control circuit comprises a counter that counts responsive to a signal corresponding to the input clock signal.

35. The system of claim 33, further comprising a pulse generator coupled to receive the input clock signal, the pulse generator generating a pulse that is used as the first input signal responsive to predetermined transitions of the input clock signal.

36. The system of claim 33 wherein the percentage of delay circuits in the signal generating delay line through which the second input signal propagates is controlled by selecting the delay line to which the second input signal is coupled.

37. The system of claim 33 wherein the signal generating delay line comprises a first signal generating delay line, and wherein the system further comprises a second signal generating delay line having a plurality of delay circuits coupled in series with each other from an initial delay circuit that is coupled to receive the second input signal to a final delay circuit, the number of delay circuits in the second signal generating delay line being a sub-multiple of the number of delay circuits in the measurement delay line and being different from the sub-multiple of the first signal generating delay line, the operation of the second signal generating delay line being controlled by the latches so that the percentage of delay circuits in the second signal generating delay line through which the second input signal propagates is substantially the same as the percentage of delay circuits in the measurement delay line through which the first input signal propagates when a subsequent transition of the first input signal is received by the measurement delay line.

38. The system of claim 33 wherein the signal generating delay line comprises a first signal generating delay line, and wherein the system further comprises a second signal generating delay line having a plurality of delay circuits coupled in series with each other from an initial delay circuit that is coupled to receive the output clock signal from the first signal generating delay line to a final delay circuit, the number of delay circuits in the second signal generating delay line being substantially the same as the number of delay circuits in the first signal generating delay line, the operation of the second signal generating delay line being controlled by the latches so that the number of delay circuits in the second signal generating delay line through which the output clock signal from the first signal generating delay line signal propagates is substantially the same as the number of delay circuits in the first signal generating delay line through which the second input signal propagates.

39. A clock multiplier system for generating an output clock signal having a frequency that is a predetermined multiple of the frequency of a periodic input clock signal, the system comprising:
- a measurement delay line including a plurality of delay circuits coupled in series with each other from an initial delay circuit that is coupled to receive a first input signal to a final delay circuit, the first input signal having transitions corresponding to predetermined transitions of the input clock signal, the delay circuits propagating the first input signal through the delay circuits from the initial delay circuit toward the final delay circuit;
- a plurality of latches coupled to the measurement delay line, the latches being set by the measurement delay line to provide an indication of the number of delay circuits in the measurement delay line through which a transition of the first input signal has propagated when a subsequent transition of the first input signal is received by the measurement delay line;
- a plurality of signal generating delay lines each having a plurality of delay circuits coupled in series with each other from an initial delay circuit that is coupled to receive a respective input signal to a final delay circuit, the number of delay circuits in each of the signal generating delay lines being a sub-multiple of the number of delay circuits in the measurement delay line, the operation of the signal generating delay lines being controlled by the latches so that the percentage of delay circuits in the signal generating delay line through which the second input signal propagates to generate respective output clock signals is substantially the same as the percentage of delay circuits in the measurement delay line through which the first input signal propagates when a subsequent transition of the first input signal is received by the measurement delay line, the output clock signals having phases relative to the second input signal that are different from each other;
- a control circuit that is operable to disable the first input signal from propagating through the measurement delay line for a disable period; and
- a logic circuit coupled to receive the output clock signals from the signal generating delay lines, the logic circuit being operable to combine the output clock signals from the signal generating delay lines to generate the output clock signal.

40. The clock multiplier system of claim 39 wherein the plurality of signal generating delay line comprises first, second, third and fourth signal generating delay lines generating output clock signals having phases that are 90 degrees different from each other, and wherein the delay the logic circuit comprises:
- a first flip-flop having a set input coupled to receive the output clock signal from the first signal generating delay line and a reset input coupled to receive the output clock signal from the second signal generating delay line;
- a second flip-flop having a set input coupled to receive the output clock signal from the third signal generating delay line and a reset input coupled to receive the output clock signal from the fourth signal generating delay line; and
- a logic gate having a first input coupled to an output of the first flip-flop and a second input coupled to an output of the second flip-flop, the logic gate having an output from which the output clock signal is generated.

41. A system for correcting the duty cycle of an input clock signal, comprising:
- a measurement delay line including a plurality of delay circuits coupled in series with each other from an initial delay circuit that is coupled to receive a first input signal to a final delay circuit, the first input signal having transitions corresponding to predetermined transitions of the input clock signal, the delay circuits propagating the first input signal through the delay circuits from the initial delay circuit toward the final delay circuit;
- a plurality of latches coupled to the measurement delay line, the latches being set by the measurement delay line to provide an indication of the number of delay circuits in the measurement delay line through which a transition of the first input signal has propagated when a subsequent transition of the first input signal is received by the measurement delay line;
- first and second signal generating delay lines each having a plurality of delay circuits coupled in series with each other from an initial delay circuit that is coupled to receive a respective input signal to a final delay circuit, the number of delay circuits in each of the first and second signal generating delay lines being a sub-multiple of the number of delay circuits in the measurement delay line, the operation of the signal generating delay lines being controlled by the latches so that the percentage of delay circuits in the signal generating delay line through which the second input signal propagates to generate respective output clock signals is substantially the same as the percentage of delay circuits in the measurement delay line through which the first input signal propagates when a subsequent transition of the first input signal is received by the measurement delay line, the output clock signals having phases that are the compliment of each other;
- a control circuit that is operable to disable the first input signal from propagating through the measurement delay line for a disable period; and
- a duty cycle correcting circuit, comprising a flip-flop having set and reset inputs, one of the set and reset inputs being coupled to receive the output clock signal from the first signal generating delay line and the other of the set and reset inputs being coupled to receive the output clock signal from the second signal generating delay line, the flip-flop having an output from which a duty cycle corrected clock signal is generated.

42. A memory device, comprising:
- a row address circuit operable to receive and decode row address signals applied to external address terminals of the memory device;
- a column address circuit operable to receive and decode column address signals applied to the external address terminals;
- a memory cell array operable to store data written to the array at a location determined by the decoded row address signals and the decoded column address signals;
- a read data path circuit operable to couple read data signals from each of the arrays to external data terminals of the memory device;
- a write data path circuit operable to couple write data signals from the external data terminals of the memory device and to couple the write data signals to one of the arrays;
- a command decoder operable to decode a plurality of command signals applied to respective external command terminals of the memory device, the command decoder being operable to generate control signals corresponding to the decoded command signals; and
- a signal generator operable to generate either the write data strobe signal or the read data strobe signal, the signal generator comprising:
- a system for generating an output clock signal that has a predetermined phase relative to a periodic input clock signal, comprising:
  - a measurement delay line including a plurality of delay circuits coupled in series with each other from an initial delay circuit that is coupled to receive a first input signal to a final delay circuit, the first input signal having transitions corresponding to predetermined transitions of an input clock signal, the delay circuits propagating the first input signal through the delay circuits from the initial delay circuit toward the final delay circuit;
  - a plurality of latches coupled to the measurement delay line, the latches being set by the measurement delay line to provide an indication of the number of delay circuits in the measurement delay line through which a transition of the first input signal has propagated when a subsequent transition of the first input signal is received by the measurement delay line;
  - a signal generating delay line having a plurality of delay circuits coupled in series with each other from an initial delay circuit that is coupled to receive a second input signal to a final delay circuit, the number of delay circuits in the signal generating delay line being a sub-multiple of the number of delay circuits in the measurement delay line, the operation of the signal generating delay line being controlled by the latches so that the percentage of delay circuits in the signal generating delay line through which the second input signal propagates to generate the strobe signal is substantially the same as the percentage of delay circuits in the measurement delay line through which the first input signal propagates when a subsequent transition of the first input signal is received by the measurement delay line; and
  - a control circuit that is operable to disable the first input signal from propagating through the measurement delay line for a disable period.

43. The memory device of claim 42 wherein the control circuit comprises a counter that counts responsive to a signal corresponding to the input clock signal.

44. The memory device of claim 42, further comprising a pulse generator coupled to receive the input clock signal, the pulse generator generating a pulse that is used as the first input signal responsive to predetermined transitions of the input clock signal.

45. The memory device of claim 42 wherein the percentage of delay circuits in the signal generating delay line through which the second input signal propagates is controlled by selecting the delay line to which the second input signal is coupled.

46. The memory device of claim 42 wherein the signal generating delay line comprises a first signal generating delay line, and wherein the system further comprises a second signal generating delay line having a plurality of delay circuits coupled in series with each other from an initial delay circuit that is coupled to receive the second input signal to a final delay circuit, the number of delay circuits in the second signal generating delay line being a sub-multiple of the number of delay circuits in the measurement delay line and being different from the sub-multiple in the first signal generating delay line, the operation of the second signal generating delay line being controlled by the latches so that the percentage of delay circuits in the second signal generating delay line through which the second input signal propagates to generate a second of the strobe signals is substantially the same as the percentage of delay circuits in the measurement delay line through which the first input signal propagates when a subsequent transition of the first input signal is received by the measurement delay line.

47. The memory device of claim 42 wherein the signal generating delay line comprises a first signal generating delay line, and wherein the system further comprises a second signal generating delay line having a plurality of delay circuits coupled in series with each other from an initial delay circuit that is coupled to receive the output clock signal from the first signal generating delay line to a final delay circuit, the number of delay circuits in the second signal generating delay line being substantially the same as the number of delay circuits in the first signal generating delay line, the operation of the second signal generating delay line being controlled by the latches so that the number of delay circuits in the second signal generating delay line through which the output clock signal from the first signal generating delay line signal propagates to generate a second of the strobe signal is substantially the same as the number of delay circuits in the second signal generating delay line through which the second input signal propagates.

48. The memory device of claim 42 wherein the memory cell array comprises a dynamic random access memory array.

49. A computer system, comprising
a processor having a processor bus;
an input device coupled to the processor through the processor bus adapted to allow data to be entered into the computer system;
an output device coupled to the processor through the processor bus adapted to allow data to be output from the computer system; and
a memory device coupled to the processor bus adapted to allow data to be stored, the memory device comprising:
a row address circuit operable to receive and decode row address signals applied to external address terminals of the memory device;
a column address circuit operable to receive and decode column address signals applied to the external address terminals; and
a memory device, comprising:
a memory cell array operable to store data written to the array at a location determined by the decoded row address signals and the decoded column address signals;
a read data path circuit operable to couple read data signals from each of the arrays to external data terminals of the memory device;
a write data path circuit operable to couple write data signals from the external data terminals of the memory device and to couple the write data signals to one of the arrays;
a command decoder operable to decode a plurality of command signals applied to respective external command terminals of the memory device, the command decoder being operable to generate control signals corresponding to the decoded command signals; and
a signal generator operable to generate either the write data strobe signal or the read data strobe signal, the signal generator comprising:
a measurement delay line including a plurality of delay circuits coupled in series with each other from an initial delay circuit that is coupled to receive a first input signal to a final delay circuit, the first input signal having transitions corresponding to predetermined transitions of an input clock signal, the delay circuits propagating the first input signal through the delay circuits from the initial delay circuit toward the final delay circuit;
a plurality of latches coupled to the measurement delay line, the latches being set by the measurement delay line to provide an indication of the number of delay circuits in the measurement delay line through which a transition of the first input signal has propagated when a subsequent transition of the first input signal is received by the measurement delay line;
a signal generating delay line having a plurality of delay circuits coupled in series with each other from an initial delay circuit that is coupled to receive a second input signal to a final delay circuit, the number of delay circuits in the signal generating delay line being a sub-multiple of the number of delay circuits in the measurement delay line, the operation of the signal generating delay line being controlled by the latches so that the percentage of delay circuits in the signal generating delay line through which the second input signal propagates to generate the strobe signal is substantially the same as the percentage of delay circuits in the measurement delay line through which the first input signal propagates when a subsequent transition of the first input signal is received by the measurement delay line; and
a control circuit that is operable to disable the first input signal from propagating through the measurement delay line for a disable period.

50. The computer system of claim 49 wherein the control circuit comprises a counter that counts responsive to a signal corresponding to the input clock signal.

51. The computer system of claim 49, further comprising a pulse generator coupled to receive the input clock signal, the pulse generator generating a pulse that is used as the first input signal responsive to predetermined transitions of the input clock signal.

52. The computer system of claim 49 wherein the percentage of delay circuits in the signal generating delay line through which the second input signal propagates is controlled by selecting the delay line to which the second input signal is coupled.

53. The computer system of claim 49 wherein the signal generating delay line comprises a first signal generating delay line, and wherein the system further comprises a second signal generating delay line having a plurality of delay circuits coupled in series with each other from an initial delay circuit that is coupled to receive the second input signal to a final delay circuit, the number of delay circuits in the second signal generating delay line being a sub-multiple of the number of delay circuits in the measurement delay line and being different from the sub-multiple in the first signal generating delay line, the operation of the second signal generating delay line being controlled by the latches so that the percentage of delay circuits in the second signal generating delay line through which the second input signal propagates to generate a second of the strobe signals is substantially the same as the percentage of delay circuits in the measurement delay line through which the first input signal propagates when a subsequent transition of the first input signal is received by the measurement delay line.

54. The computer system of claim 49 wherein the signal generating delay line comprises a first signal generating delay line, and wherein the system further comprises a second signal generating delay line having a plurality of delay circuits coupled in series with each other from an initial delay circuit that is coupled to receive the output clock signal from the first signal generating delay line to a final delay circuit, the number of delay circuits in the second signal generating delay line being substantially the same as the number of delay circuits in the first signal generating delay line, the operation of the second signal generating delay line being controlled by the latches so that the number of delay circuits in the second signal generating delay line through which the output clock signal from the first signal generating delay line signal propagates to generate a second of the strobe signal is substantially the same as the number of delay circuits in the second signal generating delay line through which the second input signal propagates.

55. The computer system of claim 49 wherein the a memory cell array comprises a dynamic random access memory array.

56. A method of generating an output clock signal having a predetermined phase relative to an input clock signal, comprising:
applying a first input signal corresponding to the input clock signal to a first of a first plurality of delay elements connected in series with each other;
determining the percentage of the delay elements in the first plurality through which the first input signal has propagated after a delay corresponding to the period of the input clock signal;
saving the result of the percentage determination;
allowing a second input signal to propagate through at least some of a second plurality of delay elements connected in series with each other, the number of delay elements in the second plurality being a sub-multiple of the number of delay elements in the first plurality, the percentage of delay elements in the second plurality through which the second input signal propagates to generate the output clock signal being controlled during each of a predetermined plurality of periods of the second input signal by the saved percentage determination result so that the percentage of delay elements in the second plurality through which the second input signal propagates is substantially equal to the percentage of the delay elements in the first plurality the first input signal has propagated.

57. The method of claim 56, further comprising preventing the first input signal from propagating through the first plurality of delay elements during the predetermined plurality of periods of the input clock signal.

58. The method of claim 56 wherein the act of applying a first input signal corresponding to the input clock signal to a first of a first plurality of delay elements connected in series with each other comprises:
generating a pulse responsive to predetermined transitions of the input clock signal; and
applying the pulse to the first of the first plurality of delay elements.

59. The method of claim 56 wherein the act of determining the percentage of the delay elements in the first plurality through which the first input signal has propagated after a delay corresponding to the period of the input clock signal comprises noting which delay elements through which the first input signal has propagated when a subsequent transition of the first input signal occurs.

60. The method of claim 56 wherein the act of controlling the percentage of delay elements in the second plurality through which the second input signal propagates to generate the output clock signal comprises controlling the delay element in the second plurality to which the second input signal is applied.

61. The method of claim 56 wherein the number of delay elements in the second plurality comprises one-quarter of the number of delay elements in the first plurality.

62. The method of claim 61 wherein the output clock signal has a phase that is offset from the input clock signal by 90 degrees.

63. The method of claim 56 further comprising allowing the second input signal to propagate through at least some of a third plurality of delay elements connected in series with each other, the number of delay elements in the third plurality being a sub-multiple of the number of delay elements in the first plurality and being different from the number of delay elements in the second plurality, the percentage of delay elements in the third plurality through which the second input signal propagates to generate a second output clock signal being controlled during each of a predetermined plurality of periods of the second input signal by the saved percentage determination result so that the percentage of delay elements in the third plurality through which the second input signal propagates is substantially equal to the percentage of the delay elements in the first plurality the first input signal has propagated.

64. The method of claim 56 further comprising allowing the output clock signal to propagate through at least some of a third plurality of delay elements connected in series with each other, the number of delay elements in the third plurality being substantially equal to the number of delay elements in the second plurality, the percentage of delay elements in the third plurality through which the output clock signal from the second plurality of delay elements propagates to generate a second output clock signal being substantially the same as the percentage of delay elements in the second plurality through which the second input signal propagates.

65. A method of generating an output clock signal having a selected phase shift relative to an input clock signal, comprising:
allowing the input clocks signal to propagate through a plurality of delay elements in a measurement delay line;

setting a latch corresponding to the number of delay elements in the measurement delay line through which the input clock signal has propagated by the next transition of the input clock signal; and using the set latch to determine the number of delay elements in a signal generating delay line through which a signal propagates to generate a respective output signal, the number of delay elements in the signal generating delay line being a sub-multiple of the number of delay elements in the measurement delay line.

66. A method of generating an output clock signal having a selected phase shift relative to an input clock signal, comprising:

allowing the input clock signal to propagate through a plurality of delay elements in a measurement delay line;

setting a latch corresponding to the number of delay elements in the measurement delay line through which the input clock signal has propagated by the next transition of the input clock signal; and using the set latch to determine the number of delay elements in a signal generating delay line through which a signal propagates to generate a respective output signal;

allowing the latch to remain set for a plurality of cycles of the input clock signal; and preventing the input clock signal from propagating through the measurement delay line during each of the plurality of cycles of the input clock signal.

* * * * *